US012740444B2

(12) United States Patent
Lin et al.

(10) Patent No.: US 12,740,444 B2
(45) Date of Patent: Sep. 15, 2026

(54) METHOD FOR MANUFACTURING A 2.5D/3D ELECTRONIC PACKAGING STRUCTURE BY EMBEDDING A WAFER INTO A CAVITY OF A GLASS SUBSTRATE

(71) Applicant: SJ Semiconductor(Jiangyin) Corporation, Jiangyin City (CN)

(72) Inventors: Chengchung Lin, Jiangyin City (CN); Jin Yang, Jiangyin City (CN)

(73) Assignee: SJ Semiconductor(Jiangyin) Corporation, Jiangyin City (CN)

( * ) Notice: Subject to any disclaimer, the term of this patent is extended or adjusted under 35 U.S.C. 154(b) by 593 days.

(21) Appl. No.: 18/132,293

(22) Filed: Apr. 7, 2023

(65) Prior Publication Data

US 2023/0335478 A1 Oct. 19, 2023

(30) Foreign Application Priority Data

Apr. 15, 2022 (CN) ......................... 202210399061.4

(51) Int. Cl.

| | |
|---|---|
| ***H10W 70/63*** | (2026.01) |
| ***H10W 70/60*** | (2026.01) |
| ***H10W 72/00*** | (2026.01) |
| ***H10W 72/20*** | (2026.01) |
| ***H10W 72/30*** | (2026.01) |
| ***H10W 99/00*** | (2026.01) |
| *H10W 90/00* | (2026.01) |

(52) U.S. Cl.

CPC ........ *H10W 70/635* (2026.01); *H10W 70/611* (2026.01); *H10W 72/013* (2026.01); *H10W 72/20* (2026.01); *H10W 72/30* (2026.01); *H10W 99/00* (2026.01); *H10W 90/734* (2026.01)

(58) Field of Classification Search

CPC ........... H01L 23/49827; H01L 23/5384; H01L 24/13; H01L 24/27; H01L 24/29; H01L 24/80; H01L 24/92; H01L 2224/80; H01L 2224/32225; H01L 2224/81; H10W 70/618; H10W 20/20

See application file for complete search history.

(56) References Cited

U.S. PATENT DOCUMENTS

2018/0005982 A1* 1/2018 Knickerbocker ............................ H01L 21/76852
2018/0286812 A1* 10/2018 Jain ......................... H01L 24/13
2020/0098592 A1* 3/2020 Okamoto ................ H01L 25/50
2021/0043571 A1* 2/2021 Hou .................... H01L 23/3128
2021/0074645 A1* 3/2021 Tsai .................... H01L 25/0655
2021/0366860 A1* 11/2021 Han .................... H01L 21/4853

(Continued)

*Primary Examiner* — Khiem D Nguyen
(74) *Attorney, Agent, or Firm* — IPRTOP LLC

(57) ABSTRACT

A 2.5D/3D electronic packaging structure and a method for manufacturing it are disclosed. The method includes: disposing a metal array over a wafer, fixing a first die and a second die to the metal array; removing a portion of the wafer to expose bottom surfaces of the first die and the second die; providing a glass substrate, forming a cavity on the surface of the glass substrate; forming vias through the glass substrate, filling the vias with metal materials to form metal pillars; forming first solder pads each at a first end of one of the metal pillars, and forming second solder pads each at a second end of that metal pillar; embedding the wafer in the cavity, and connecting the first solder pads to the first die and the second die, and connecting the second solder pads to an organic substrate.

7 Claims, 3 Drawing Sheets

(56) References Cited

U.S. PATENT DOCUMENTS

| | | | | |
|---|---|---|---|---|
| 2022/0115326 | A1* | 4/2022 | Manusharow | H01L 25/065 |
| 2022/0238445 | A1* | 7/2022 | Olson | H01L 23/49822 |
| 2022/0406751 | A1* | 12/2022 | Elsherbini | H01L 21/6835 |

* cited by examiner

METHOD FOR MANUFACTURING A 2.5D/3D ELECTRONIC PACKAGING STRUCTURE BY EMBEDDING A WAFER INTO A CAVITY OF A GLASS SUBSTRATE

CROSS REFERENCE TO RELATED APPLICATION

The present application claims the benefit of priority to Chinese Patent Application No. CN 202210399061.4, entitled "2.5D/3D ELECTRONIC PACKAGING STRUCTURE AND METHOD FOR MANUFACTURING SAME", filed with CNIPA on Apr. 15, 2022, the disclosure of which is incorporated herein by reference in its entirety for all purposes.

FIELD OF TECHNOLOGY

The present disclosure generally relates to semiconductor packaging technology, and particularly to a 2.5D/3D electronic packaging structure and a method for manufacturing the same.

BACKGROUND

In recent years, integrated circuits (IC) packaging has experienced rapid evolution from 2D IC packaging to 2.5D and 3D IC packaging, driven by growing performance demand imposed by applications like high performance computing, artificial intelligence, and mobile phones, etc. Heterogeneous integration (HCl) is one of the mainstream packaging systems. For HCl, how to develop fully-integrated 2.5D/3D IC packages while keeping the packaging cost low has remained a key challenge.

In some existing packaging structures, multiple dies are directly assembled onto an organic substrate through an embedded silicon bridge, and such packaging structures are called embedded multi-die interconnect bridge (EMIB) structures. EMIB structures require embedding the silicon bridge into the organic substrate, which involves a complex manufacturing process, thus incurs high cost and long production cycles. Also, EMIB related processes involve multiple rounds of fabrication respectively performed by certain substrate manufacturers and die manufacturers, both of which have no suitable alternatives.

SUMMARY

The present disclosure provides a method for manufacturing a 2.5D/3D electronic packaging structure, including: disposing a metal array over a wafer, fixing a first die and a second die to the metal array, wherein a bottom surface of the first die and a bottom surface of the second die face the wafer respectively; removing a portion of the wafer to partially expose the bottom surfaces of the first die and the second die; forming a cavity on a surface of a glass substrate; forming vias in the glass substrate, wherein the vias extend through the glass substrate, and filling the vias with metal materials to form metal pillars; forming first solder pads, wherein each of first solder pads is disposed at a first end of one of the metal pillars, and forming second solder pads, wherein each of second solder pads is disposed at a second end of said metal pillars; and embedding the wafer into the cavity, connecting the first solder pads of the metal pillars to the first die and the second die respectively, and connecting the second solder pads to a surface of the organic substrate.

The present disclosure also provides a 2.5D/3D electronic packaging structure, including: a wafer; wherein a metal array is disposed over the wafer; a first die and a second die, fixed to the metal array; a glass substrate; a cavity, formed on a surface of the glass substrate, wherein the wafer is embedded in the cavity; vias, extending through the glass substrate; metal pillars, filling in the vias; solder pads, comprising first solder pads and second solder pads, wherein each of the first solder pads is formed at a first end of one of the metal pillars, wherein each of the second solder pads is formed at a second end of said metal pillars, and wherein the first solder pads are connected to the first die and the second die; and an organic substrate, connected to the second solder pads.

BRIEF DESCRIPTION OF THE DRAWINGS

FIGS. 1 to 11 are schematic cross-sectional diagrams of intermediate structures obtained after performing all major operation steps following a method for manufacturing a 2.5D/3D electronic packaging structure according to the present disclosure, wherein FIG. 11 is a schematic cross-sectional diagram of the 2.5D/3D electronic packaging structure of the present disclosure.

REFERENCE NUMERALS

1 Metal Array
2 Wafer
3 First Die
4 Second Die
5 Glass Substrate;
6 Cavity
7 Via
8 Metal Pillar
9 Solder Pad
10 Organic Substrate

DETAILED DESCRIPTION

The following describes the implementation of the present disclosure through specific examples, and those skilled in the art can easily understand other advantages and effects of the present disclosure from the content disclosed in this specification. The present disclosure can also be implemented or applied through other different specific examples. Various details in this specification can also be modified or changed based on different viewpoints and applications without departing from the spirit of the present disclosure.

Please refer to the attached drawings. It should be noted that the drawings provided in this disclosure only illustrate the basic concept of the present disclosure in a schematic way, so the drawings only show the components related to the present disclosure. The drawings are not necessarily drawn according to the number, shape, and size of the components in actual implementation; during the actual implementation, the type, quantity, and proportion of each component can be changed as needed, and the components' layout may also be more complicated.

The present disclosure provides a method for manufacturing a 2.5D/3D electronic packaging structure, which includes operations described below.

Operation 1): providing a number of dies and the dies have interconnecting legs at the bottom of the dies, disposing a metal array 1 over a wafer 2, fixing a first die 3 and a second die 4 to the metal array 1, wherein the bottom interconnecting legs are attached to the metal array 1, and the bottom surfaces of the first die 3 and the second die 4 face the wafer 2, and removing a portion of the wafer 2 to partially expose the bottom surfaces of the first die 3 and the second die 4.

As an example, details of Operation 1) are shown in FIGS. 1 to 5.

Figure 1:
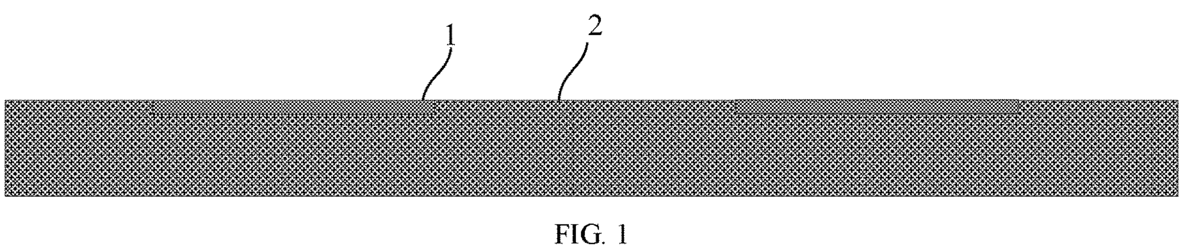

Referring to FIG. 1, the wafer 2 is first provided, which is uncut at this time. The metal array 1 is provided on a surface of the wafer 2. In some examples, the metal array 1 may include a number of sub arrays. As an example, only two sub arrays of the metal array 1 are shown in FIG. 1.

Figure 2:
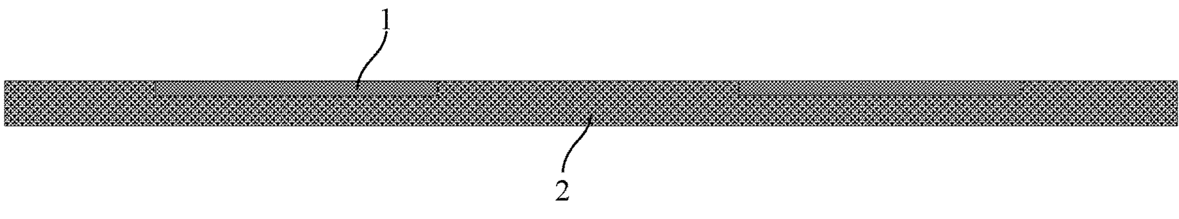

Referring to FIG. 2, a thinning process is performed on the back side of the wafer 2 to make the wafer 2 thinner. The back side of the wafer 2 faces away from the metal array 1. The thinning process can be done by grinding and polishing, or a chemical mechanical polishing process. The thickness of the wafer 2 after thinning is such that it can be embedded in a cavity of the glass substrate, and the thinning of the wafer 2 also facilitates a subsequent wafer cutting process.

Figure 3:
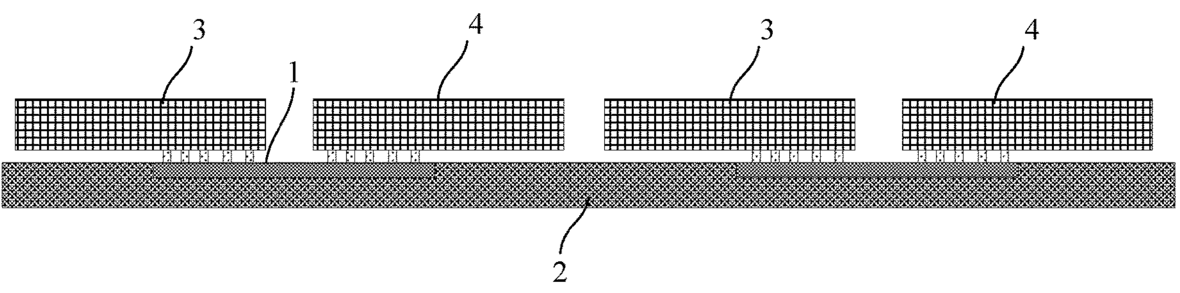

Referring to FIG. 3, multiple sets of first dies 3 and second dies 4 are fixed onto the metal array 1. Each set includes a first die 3 and a second die 4, which may be fixed onto the same sub array of the metal array 1.

Figure 4:
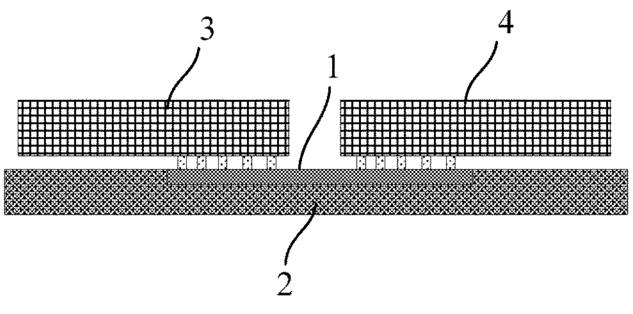

Referring next to FIG. 4, the wafer 2 is cut to obtain a discrete number of smaller wafer pieces, for convenience, the cut out smaller ones are still referred to using the reference numeral 2, and each smaller wafer 2 has the first die 3 and the second die 4 fixed on it. For example, the cutting of the wafer 2 can be carried out using a cutting knife or, by laser cutting. Hereinafter, the description focuses on one of the smaller wafers 2 and the attached first die 3 and second die 4.

Figure 5:
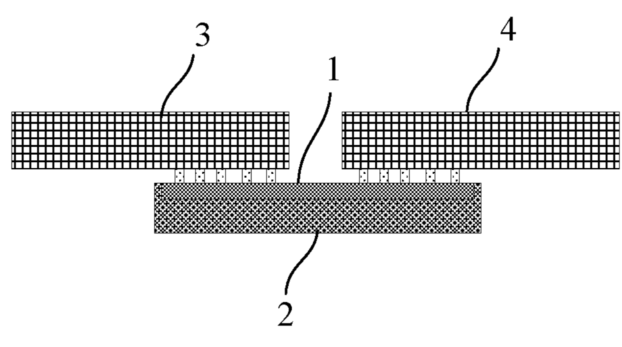

Referring to FIG. 5, through a selective etching process, part of the wafer 2 is etched away to partially expose the bottom surfaces of the first die 3 and the second die 4. The width of the wafer 2 selectively being etched is arranged that the remaining wafer 2 can be embedded in the cavity of the glass substrate; the etching also enables the first die 3 and second die 4 to be subsequently connected to metal pillars in the glass substrate.

Operation 1) can also be performed in other ways; for example, the first die 3 and the second die 4 are first transferred onto a temporary glass substrate, which is then vacuum-sucked, the cut wafer 2 (i.e., a silicon bridge wafer) having the metal array 1 is bonded and assembled to the first die 3 and the second die 4 on the temporary glass carrier, and finally the temporary glass carrier is removed to form the structure as shown in FIG. 5.

As an example, the first die 3 and the second die 4 can be semiconductor dies/chips suitable for packaging, either stand-alone functional chips or integrated functional chips, such as high-bandwidth-memory (HBM) chips, system-on-a-chip (SoC) chips, etc.

As an example, the first die 3 and the second die 4 are fixed to the metal array 1 by fusion bonding or hybrid bonding. Fusion bonding is a process that utilizes mainly interfacial proximity forces to complete the bonding, thereby improving the reliability of the bonding process and bonding strength, and in turn increasing the package yield.

As an example, materials of the metal array 1 include copper; the materials of the metal array 1 may also include one or more of tungsten, aluminum, nickel, gold, silver, and titanium.

The wafer 2 is preferably a silicon wafer, and the structure formed as shown in FIG. 5 is called a die-silicon-bridge interconnect structure.

Figure 6:
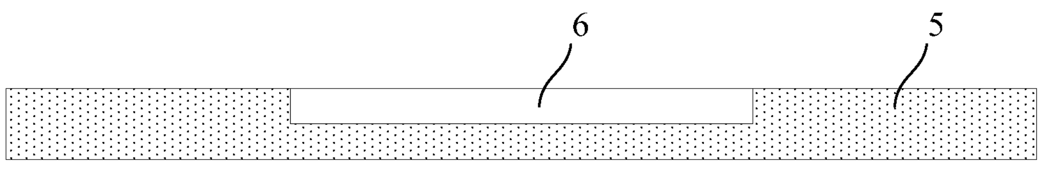

Operation 2), as shown in FIG. 6, includes: providing a glass substrate 5, and forming a cavity 6 on the surface of the glass substrate 5.

As an example, the glass substrate 5 has a coefficient of thermal expansion in a range of 3 ppm/° C. to 4 ppm/° C. or in a range of 6 ppm/° C. to 9 ppm/° C. Preferably, the glass substrate 5 has the coefficient of thermal expansion in the range of 3 ppm/° C. to 4 ppm/° C.; the glass substrate 5 may be any other packaging structure whose material selections facilitates reducing warpage and stress in the overall packaging structure. In one example, the coefficient of thermal expansion of the glass substrate 5 is about 3 ppm/° C. In one example, the coefficient of thermal expansion of the glass substrate 5 is about 3.5 ppm/° C. The thermal expansion properties of the glass substrate 5 can be utilized to compensate for the overall warpage of the packaging structure.

As an example, the cavity 6 can be formed on the surface of the glass substrate 5 through a laser-assisted dry etching process. Other suitable etching processes can also be utilized for etching of the glass substrate 5 to form the cavity 6. Adopting the laser-assisted dry etching process to form the cavity 6 helps to simplify the preparation process and reduce the production cost.

Figure 7:
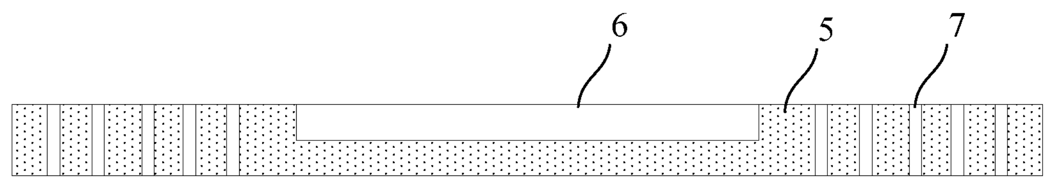
Figure 8:
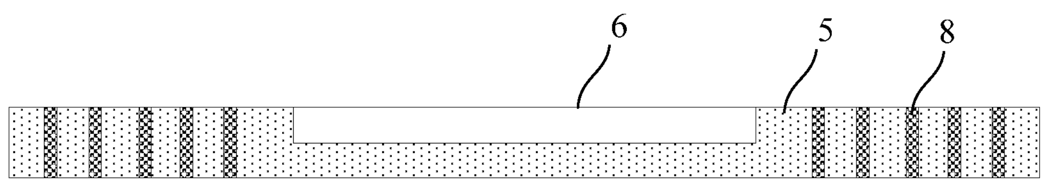

Next, Operation 3) is performed, which includes forming vias 7 that extend through the glass substrate 5, as shown in FIG. 7, and filling the vias 7 with metal materials to form metal pillars 8, as shown in FIG. 8.

Optionally, the vias 7 are through-glass-vias, and are formed through a laser-assisted dry etching process. Other suitable etching processes can also be utilized for etching of the glass substrate 5 to form the vias 7. Adopting the laser-assisted dry etching process to form the cavity 7 helps to simplify the preparation process and reduce the production cost.

As an example, materials of the metal array 8 include copper; the materials of the metal array 1 may also include one or more of tungsten, aluminum, nickel, gold, silver, and titanium.

The cavity 6 is used to accommodate the wafer 2, and the layout of the vias 7 and metal pillars 8 needs to align to electrical lead-out positions of the first die 3 and second die 4 to ensure interconnection accuracy between the metal pillar 8 and the first die 3 and second die 4.

Figure 9:
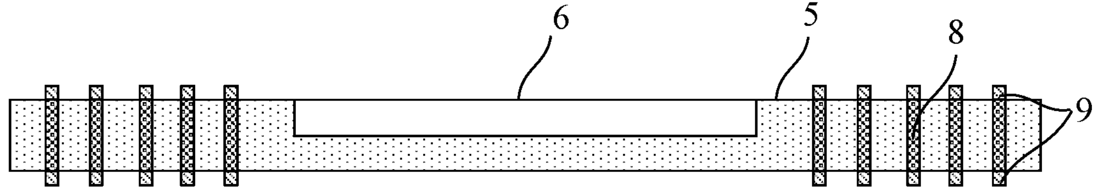

Next, Operation 4) is performed, as shown in FIG. 9; Operation 4) includes forming solder pads 9 connected to the metal pillars 8; wherein the solder pads 9 includes first solder pads 9A at a first end of the vias 7, and second solder pads 9B at a second end of the vias 7.

Figure 10:
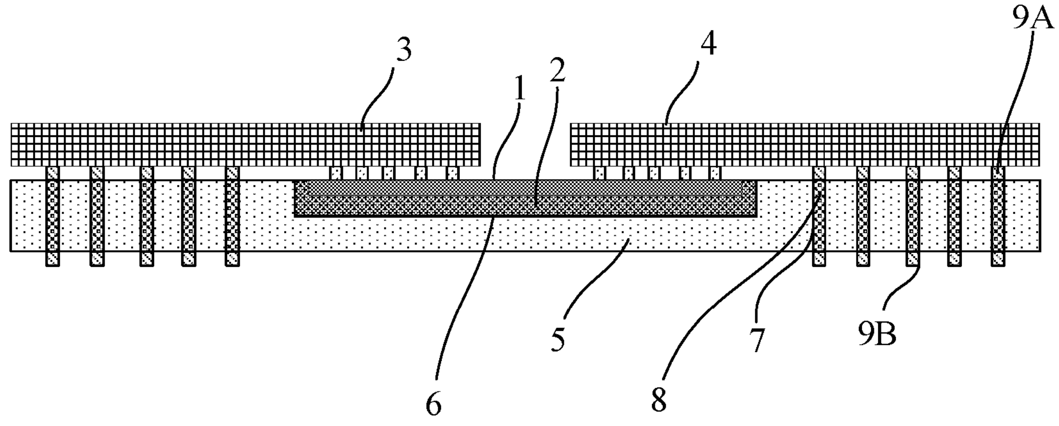
Figure 11:
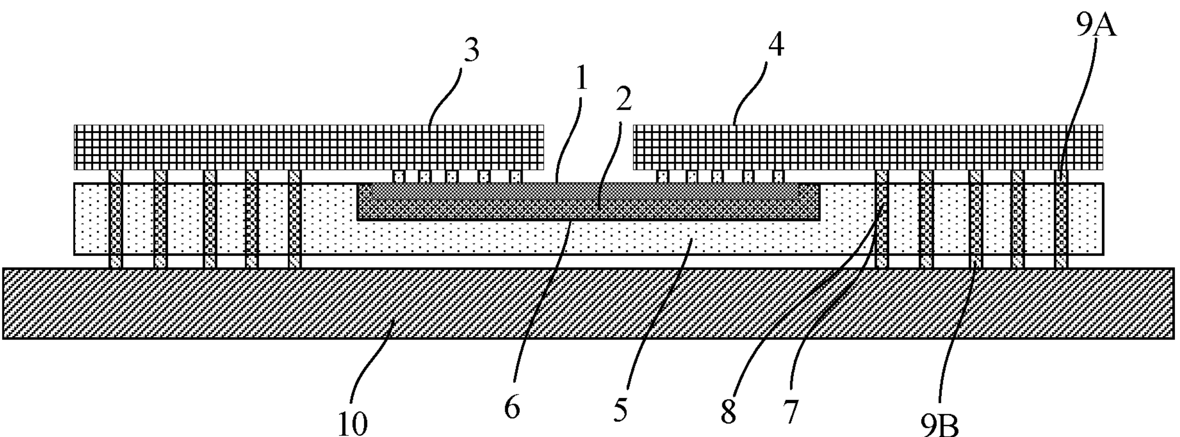

Finally, Operation 5) is performed, as shown in FIG. 10; Operation 5) includes embedding the wafer 2 in the cavity 6, connecting the first solder pads 9A to the first die 3 and the second die 4, as shown in FIG. 11, and connecting the second solder pads 9B to an organic substrate 10.

As an example, the first solder pads 9A are connected to the first die 3 and the second die 4 through a micro-bump reflow process and a thermal compression bonding process; that is, metal bumps or solder balls are first formed on first surfaces of the metal pillars 8, then reflowing is performed on the metal bumps/solder balls to form the first solder pads 9A, and then an in-situ TCB process is performed to electrically connect the first solder pads 9 to the first die 3 and the second die 4.

As an example, the second solder pads 9B are connected to the organic substrate through a micro-bump reflow process and a TCB process; that is, metal bumps or solder balls are first formed on second surfaces of the metal pillars 8, then reflowing is performed on the metal bumps/solder balls to form the second solder pads 9B, and then an in-situ TCB process is performed to electrically connect the second solder pads 9 to the organic substrate 10.

In the present disclosure, the glass substrate 5 is adopted as a carrier, the vias 7 and cavity 6 are formed in specific areas of the glass substrate 5, the dies 3 and 4 are connected to the organic substrate 10 through the metal pillars 8 in the vias 7, and the silicon bridge (i.e., the wafer 2 as shown in FIG. 5) is accommodated in the cavity 6, which avoids directly embedding the silicon bridge in the organic substrate 10 and helps reduce the packaging cost.

As shown in FIG. 11, a 2.5D/3D electronic packaging structure is also provided, and can be obtained by executing the above-mentioned method; the packaging structure includes:

- a wafer 2; wherein a metal array 1 is disposed over the wafer 2;
- a first die 3 and a second die 4, fixed to the metal array 2;
- a glass substrate 5;
- a cavity 6, formed on a surface of the glass substrate 5 and for accommodating the wafer 2;
- vias 7, extending through the glass substrate 5;
- metal pillars 8, filled in the vias 7;
- solder pads 9, including first solder pads 9A and second solder pads 9B, wherein the first solder pads 9A are formed at a first end of the vias 7, the second solder pads 9B are formed at a second end of the vias 7, and the first solder pads 9A are connected to the first die and the second die;
- an organic substrate 10, connected to the second solder pads 9B.

As an example, the glass substrate 5 has a coefficient of thermal expansion in a range of 3 ppm/° C. to 4 ppm/° C. or in a range of 6 ppm/° C. to 9 ppm/° C. Preferably, the coefficient of thermal expansion of the glass substrate 5 is in a range of 3 ppm/° C. and 4 ppm/° C. In one example, the coefficient of thermal expansion of the glass substrate 5 is about 3 ppm/° C. In one example, the coefficient of thermal expansion of the glass substrate 5 is about 3.5 ppm/° C. The thermal expansion properties of the glass substrate 5 can be utilized to compensate for the overall warpage of the packaging structure.

Optionally, materials of the metal pillars 8 include copper, and materials of the metal array 1 include copper. As an example, materials of the metal array 1 and the metal pillars 8 include one or more of tungsten, aluminum, nickel, gold, silver, and titanium.

In the electronic packaging structure of the present disclosure, the glass substrate 5 is adopted as a carrier, the vias 7 and cavity 6 are formed in specific areas of the glass substrate 5, the dies 3 and 4 are connected to the organic substrate 10 through the metal pillars 8 in the vias 7, electrical structures in the dies 3, 4 are precisely led out to the organic substrate 10, and the cavity 6 is used to accommodate the wafer 2 (i.e., the silicon bridge), so that the die-silicon-bridge interconnect structure is better fixed to the glass substrate 5. The present disclosure eliminates the need to directly embed the silicon bridge in the organic substrate, which helps to reduce the packaging cost. The superior electrical properties of the glass substrate compared to the silicon substrate, especially in terms of higher resistivity and lower insertion loss, are also taken advantage of by the present structure. In addition, other passive and active components (such as capacitors can be encapsulated in the cavity to enhance the electrical performance of the entire package.

In summary, the present disclosure provides a 2.5D/3D electronic packaging structure and a method for manufacturing the same have been provided; the method includes: disposing a metal array over a wafer, fixing a first die and a second die to the metal array, and removing a portion of the wafer to expose bottom surfaces of the first die and the second die; providing a glass substrate, forming a cavity on a surface of the glass substrate; forming vias, filling the vias with metal materials to form metal pillars; forming first solder pads at a first end of the vias, and second solder pads at a second end of the vias; embedding the wafer in the cavity, and connecting the first solder pads to the first die and the second die, and connecting the second solder pads to an organic substrate. In the present disclosure, the glass substrate 5 is adopted as a carrier, the vias 7 and cavity 6 are formed in specific areas of the glass substrate 5, the dies are connected to the organic substrate 10 through the metal pillars 8 in the vias 7, and the silicon bridge is accommodated in the cavity 6, which avoids directly embedding the silicon bridge in the organic substrate 10 and helps reduce the packaging cost. The superior electrical properties of the glass substrate compared to the silicon substrate, especially higher resistivity, and lower insertion loss, are also taken advantage of by the present disclosure. In addition, other passive and active components (such as capacitors can be encapsulated in the cavity to enhance the electrical performance of the entire package.

Therefore, the present disclosure effectively overcomes various shortcomings of the existing techniques and possesses a high value for industrial application.

The above-mentioned examples only exemplarily illustrate the principles and effects of the present disclosure, but are not used to limit the present disclosure. Any person skilled in the art may modify or change the above examples without violating the spirit and scope of the present disclosure. Therefore, all equivalent modifications or changes made by those skilled in the art without departing from the spirit and technical concepts disclosed by the present disclosure should still be covered by the attached claims of the present disclosure.

What is claimed is:

1. A method for manufacturing a 2.5D/3D electronic packaging structure, comprising:

forming a die-silicon-bridge interconnect structure, comprising:

disposing a metal array over a silicon wafer, fixing a first die and a second die to the metal array over the silicon wafer so as to electrically connect the first and the second dies, wherein a bottom surface of the first die and a bottom surface of the second die face the silicon wafer respectively;

removing a portion of the silicon wafer to partially expose the bottom surfaces of the first die and the second die;

forming a glass substrate as a carrier, comprising:

forming a cavity on a surface of the glass substrate;

embedding the silicon wafer with the metal array into the cavity in the glass substrate;

forming vias in the glass substrate at outsides of the cavity, wherein the vias extend through the glass substrate, and filling the vias with metal materials to form metal pillars;

forming first solder pads, wherein each of first solder pads is disposed at a first end of one of the metal pillars, and forming second solder pads, wherein each of second solder pads is disposed at a second end of said metal pillars;

forming a die lead-out, comprising:

connecting the first solder pads of the metal pillars to the first die and the second die respectively from the outside of the cavity;

providing an organic substrate; and connecting the second solder pads to a surface of the organic substrate, so as to connect the first die and the second die to the organic substrate.

2. The method for manufacturing the 2.5D/3D electronic packaging structure according to claim 1, wherein the first die and the second die are fixed to the metal array by fusion bonding or by hybrid bonding, and wherein the metal array comprises a line width or a spacing equal to or less than 1 micron.

3. The method for manufacturing the 2.5D/3D electronic packaging structure according to claim 1, wherein the glass substrate has a coefficient of thermal expansion in a range of 3 ppm/° C. to 4 ppm/° C. or in a range of 6 ppm/° C. to 9 ppm/° C.

4. The method for manufacturing the 2.5D/3D electronic packaging structure according to claim 1, wherein the vias are through-glass-vias (TGVs) and are formed using a laser-assisted dry etching process.

5. The method for manufacturing the 2.5D/3D electronic packaging structure according to claim 1, wherein a material of the metal pillars comprises copper, and wherein a material of the metal array comprises copper or tungsten.

6. The method for manufacturing the 2.5D/3D electronic packaging structure according to claim 1, wherein the first solder pads are connected to the first die and the second die using a micro-bump reflow process and a thermal compression bonding (TCB) process.

7. The method for manufacturing the 2.5D/3D electronic packaging structure according to claim 1, wherein the second solder pads are connected to the organic substrate using a micro-bump reflow process and a TCB process.

* * * * *